US006869155B1

(12) United States Patent
Zlatanov

(10) Patent No.: US 6,869,155 B1
(45) Date of Patent: Mar. 22, 2005

(54) METHOD AND APPARATUS FOR MASKING A WORKPIECE WITH INK

(75) Inventor: Borislav Zlatanov, San Jose, CA (US)

(73) Assignee: Ultratech, Inc., San Jose, CA (US)

( * ) Notice: Subject to any disclaimer, the term of this patent is extended or adjusted under 35 U.S.C. 154(b) by 346 days.

(21) Appl. No.: 09/923,755

(22) Filed: Aug. 6, 2001

(51) Int. Cl.[7] .................................................. B41J 3/00
(52) U.S. Cl. .................................. 347/2; 347/1; 347/38
(58) Field of Search .................... 347/2, 1, 38; 427/261; 700/213; 430/302; 505/325

(56) References Cited

U.S. PATENT DOCUMENTS

| | | | | |
|---|---|---|---|---|
| 5,546,179 A | * | 8/1996 | Cheng | 356/73 |
| 5,820,932 A | * | 10/1998 | Hallman et al. | 427/261 |
| 6,275,742 B1 | * | 8/2001 | Sagues et al. | 700/213 |

* cited by examiner

Primary Examiner—Stephen D. Meier
Assistant Examiner—Lam Nguyen
(74) Attorney, Agent, or Firm—Allston L. Jones

(57) ABSTRACT

A method and apparatus for masking a workpiece with a layer of ink from an inkjet head is disclosed. The masking prevents exposure of select regions of a photosensitive workpiece. The apparatus includes a workpiece pre-aligner for movably supporting and aligning the workpiece. The inkjet head is arranged to be in operable communication with the photosensitive layer of the workpiece when positioned on the pre-aligner and is adapted for providing a select mask of opaque ink on a photosensitive layer. Where the photosensitive layer is a negative tone photoresist, upon exposure the portion of the photosensitive layer that is not exposed because of the presence of the mask is removed upon developing. In this manner, select regions of the workpiece can be kept clear of photoresist or otherwise patterned with indicia such as alphanumeric symbols or barcodes.

20 Claims, 3 Drawing Sheets

METHOD AND APPARATUS FOR MASKING A WORKPIECE WITH INK

BACKGROUND OF THE INVENTION

1. Field of the Invention

The present invention relates to the lithographic exposure and patterning of workpieces, and in particular relates to an ink-based method and apparatus for masking a workpiece to prevent exposure of select regions on the workpiece.

2. Description of the Prior Art

Lithography techniques are used in the manufacturing of microdevices, such as, integrated circuits (ICs), flat panel displays, microelectromechanical systems (MEMS), the formation of bump IC interconnects for "flip chip" interconnection technology, and the like. The lithographic process involves the use of photosensitive workpieces ("wafers") and the selective exposure of such workpieces with radiation (e.g., UV light). Workpiece photosensitivity is typically achieved by coating or otherwise applying a layer of photosensitive material called photoresist to the workpiece surface. Photoresist can either be "positive-tone," in which the exposed resist is removed upon developing, or "negative-tone," in which the unexposed resist is removed upon developing. Generally, the lithography process includes the steps of coating the workpiece with photoresist, exposing the photoresist with the image of a mask to form a latent pattern in the photoresist, developing the photoresist to form a three dimensional image, etching the photoresist to form a corresponding three dimensional pattern in the workpiece, and then removing the excess photoresist. These steps are repeated a requisite number of times to form the particular device structure in the workpiece.

In certain lithography applications involving negative photoresist, it is preferred that select regions of the workpiece outside of the individual exposure fields remain completely unexposed so that the resist in these regions is removed upon developing. One example application is bump interconnect lithography, which involves the formation of conductive (e.g., gold or aluminum) bumps on a workpiece (wafer) that are used to contact circuit lines on a circuit board. Bump lithography includes an electrochemical plating step to form the conductive bumps that requires contacting most of the edge of the wafer with an electrode. For this purpose, substantially all of the edge of the wafer must be free of all photoresist to ensure uniform electrical contact.

When one-to-one contact or near-contact photolithography is used the entire wafer is exposed at once and the exclusion of the edge is achieved by incorporating the desired exclusion into the mask pattern. However, in step and repeat photolithography it is not possible to define the exclusion area into the mask pattern since the stepping pattern depends on the pattern size and the step size.

SUMMARY OF THE INVENTION

The present invention relates to the lithographic exposure and patterning of work pieces using either reduction or 1× step and repeat lithography, and in particular relates to an ink-based method and apparatus for selectively masking a workpiece to prevent exposure of select regions on the workpiece.

A first aspect of the invention is an apparatus for masking a workpiece coated with a photosensitive layer, to prevent exposure of select regions of the photosensitive layer. The apparatus includes a workpiece pre-aligner or other system for movably supporting and aligning the workpiece, and an ink delivery system, such as an inkjet head, arranged to be in communication with the photosensitive layer of the workpiece for providing a pattern of opaque ink on a photosensitive layer. The apparatus may also include a programmable control unit connected to the ink delivery system and the pre-aligner, for coordinating and controlling the masking process.

A second aspect of the invention is a method of selectively masking a photosensitive workpiece to prevent exposure of select regions. The method includes determining the one or more select regions of the photosensitive workpiece surface that need to remain unexposed, and then masking the one or more select regions with a layer of ink. The ink is opaque to a wavelength of radiation that activates the photosensitive workpiece.

DETAILED DESCRIPTION OF THE INVENTION

The present invention relates to the lithographic exposure and patterning of workpieces, and in particular relates to an ink-jet-based method and apparatus for masking a workpiece to prevent exposure of select regions on the workpiece.

Figure 1:
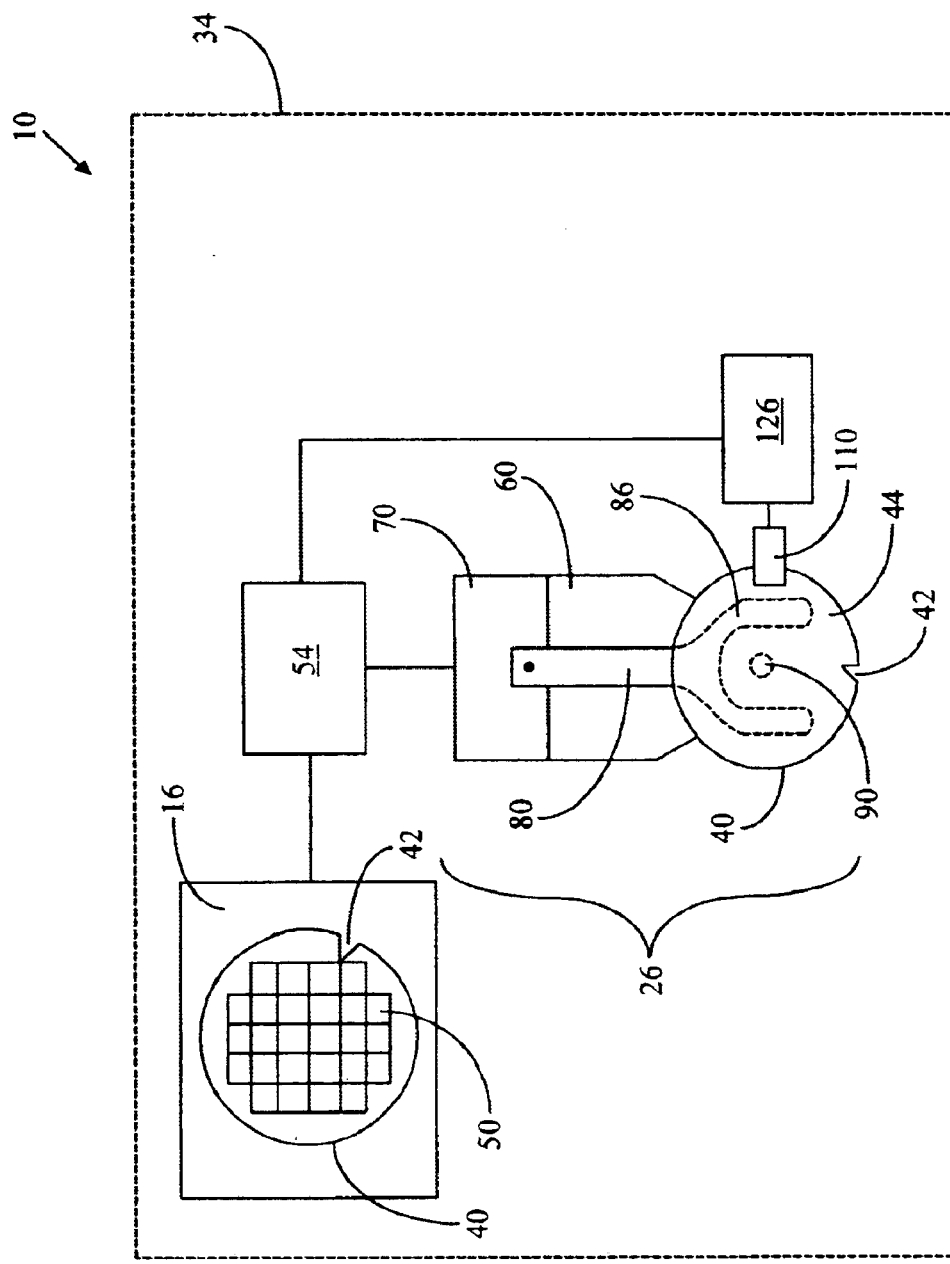
FIG. 1 is a schematic plan view of a lithography tool showing the workpiece stage, workpiece pre-aligner and main controller and housing, and ink-jet printer system arranged on the pre-aligner according to the present invention.

With reference now to FIG. 1, there is shown a lithography tool 10 that includes a workpiece stage 16 and a workpiece pre-aligner 26 in operable communication with the workpiece stage. Workpiece stage 16 and pre-aligner 26 are enclosed in a housing 34 that provides for control of the environment within tool 10. Other elements of the lithography tool, such as the projection lens, mask stage, illuminator, etc., that reside above the wafer stage are not shown in FIG. 1 for clarity of the present invention.

Workpiece stage 16 is designed to movably support a workpiece (wafer) 40. Workpiece 40 includes a reference feature 42, such as a notch or a flat that facilitates alignment of the workpiece to another reference. Workpiece 40 also includes an upper surface 44. Workpiece 40 is moved beneath the projection lens by workpiece stage 16 so that multiple exposure fields 50 can be formed (exposed) on the workpiece.

Pre-aligner 26 is for receiving a workpiece from a workpiece handler or other workpiece source (not shown) and precisely aligning and centering the workpiece to a known reference position on the pre-aligner. This allows for the workpiece to be transferred to workpiece stage 16 in a known alignment state. Consequently, the workpiece can quickly be finely aligned on workpiece stage 16 and exposed.

Lithography tool 10 also includes a main controller 54 that controls the operation of the lithography tool, and is operatively connected to workpiece stage 16 and pre-aligner 26 to control the pre-alignment and delivery of workpieces to workpiece stage 16. Main controller 54 also optionally controls the overall operation of pre-aligner 26 in carrying out the ink-based masking method described below in conjunction with the lithography process.

Figure 2:
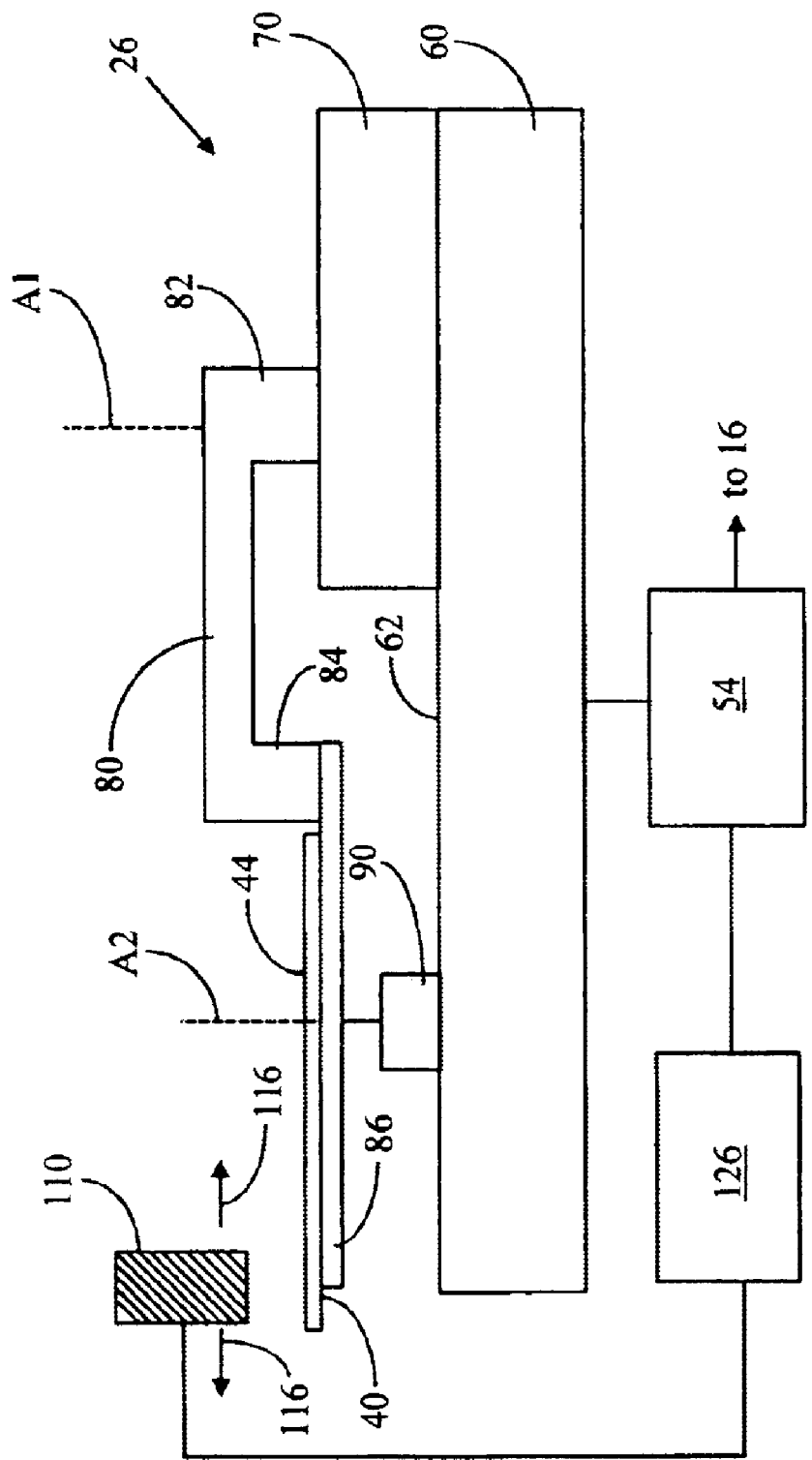
FIG. 2 is a side view of the workpiece pre-aligner with a workpiece supported on the fork of the aligner and the inkjet head arranged in proximity to the workpiece near the edge.

With reference now also to FIG. 2. In an example embodiment, pre-aligner 26 includes a base 60 with an upper surface 62. A motor unit 70 is attached to upper surface 62 towards one end of base 60. An arm 80 with first and second ends 82 and 84, respectively. Is connected to motor unit 70 located at first end 82, allowing the motor to rotate the arm about an axis A1 passing through the first end 82. Second end 84 of arm 80 includes a fork 86 capable of supporting workpiece 40. Motor unit 70 is also adapted to raise and lower arm 80 at first end 82 so that fork 86 can be raised and lowered when moving, adjusting the position of or otherwise engaging workpiece 40.

Pre-aligner 26 also includes a workpiece rotation member 90 arranged beneath fork 86 on surface 62. Member 90 is capable of measuring the position of the workpiece on fork 86 (e.g., the location of reference mark 42) and engaging the workpiece to rotate it about axis A2 to properly orient the workpiece. Such rotation is generally necessary for pre-aligning (e.g., centering and orienting) workpiece 40 prior to it being transferred to workpiece stage 16 via the movement of arm 80. Generally, pre-aligner 26 serves in the present invention as a convenient device for providing the necessary support and rotation of a workpiece to perform ink masking. In an example embodiment of the present invention, pre-aligner 26 may be simply a workpiece rotation device without pre-alignment capability that is remote from lithography tool 10. However, it is advantageous to use pre-aligner 26 to perform ink masking of the workpiece, since it is already part of lithography tool 10 and is designed for moving and positioning a workpiece onto workpiece stage 16 in anticipation of lithographically processing the workpiece.

With continuing reference to FIGS. 1 and 2, an ink delivery device 110 is arranged near fork 86 so that when workpiece 40 is supported thereon, the ink delivery device is in close proximity (e.g., from one to several millimeters) to workpiece upper surface 44. Ink delivery device 110 is preferably movable over upper surface 44 (as indicated by arrows 116) so that it can print features anywhere on the workpiece upper surface. In an example embodiment of the present invention, ink delivery device 110 need only move along a radial line as workpiece 40 is rotated underneath the head. In another example embodiment of the present invention. Ink delivery device 110 includes an ink-jet head.

With continuing reference to FIG. 2, connected to ink delivery device 110 is a control unit 126 that controls the deposition of ink by the ink delivery device. Control unit 126 is also connected to main controller 54 that communicates with pre-aligner 26 so that information about the position and rotation of the workpiece, etc. (i.e., generally, the workpiece state) can be provided to control unit 126.

Ink delivery device 110 and associated control unit 126 constitute an ink delivery system. An example of a commercially available ink delivery system suitable for use in the present invention is the Domino A400 inkjet system available from Domino UK Ltd., Cambridge, England.

Control unit 126 can be programmed with printing instructions for selectively masking upper surface 44 of workpiece 40. In the present invention, the ink used in ink delivery device 110 is opaque to the wavelength of radiation used to expose workpiece 40. Further, the ink layer is deposited with a thickness sufficient to block exposure of the photoresist. For negative tone photoresist, this means that the masked regions of the photoresist remain unexposed and so are removed from the workpiece upon developing.

Preferably, the ink layer deposited with ink delivery device 110 is fast-drying (1–2 seconds) and is suitable for (e.g., adheres to) the particular photoresist material formed upon upper surface 44 of workpiece 40. The patterns capable of being formed by ink delivery device 110 include alpha-numeric characters, bar codes, various small- and large-scale line patterns, including an annulus of a few millimeters in width formed along the very edge of the workpiece. Though some masking patterns may be more useful than others. In practice any feature capable of being formed with a conventional inkjet printer system can be formed on workpiece upper surface 44 through the appropriate programming of control unit 126.

In an example embodiment of the present invention, the photoresist used on workpiece 40 to provide the required photosensitivity is a negative-tone dry film photoresist, which typically include a thin-film protective coating. An example of such a photoresist is RISTON® manufactured by DUPONT, which includes a thin MYLAR® coating that is transparent to the exposure wavelength of radiation. In the case of a MYLAR®-coated resist, the ink used should be one that readily adheres to and dries quickly on MYLAR®. MYLAR® is a trademark of a polyethylene terephthalate polyester film.

Figure 3:
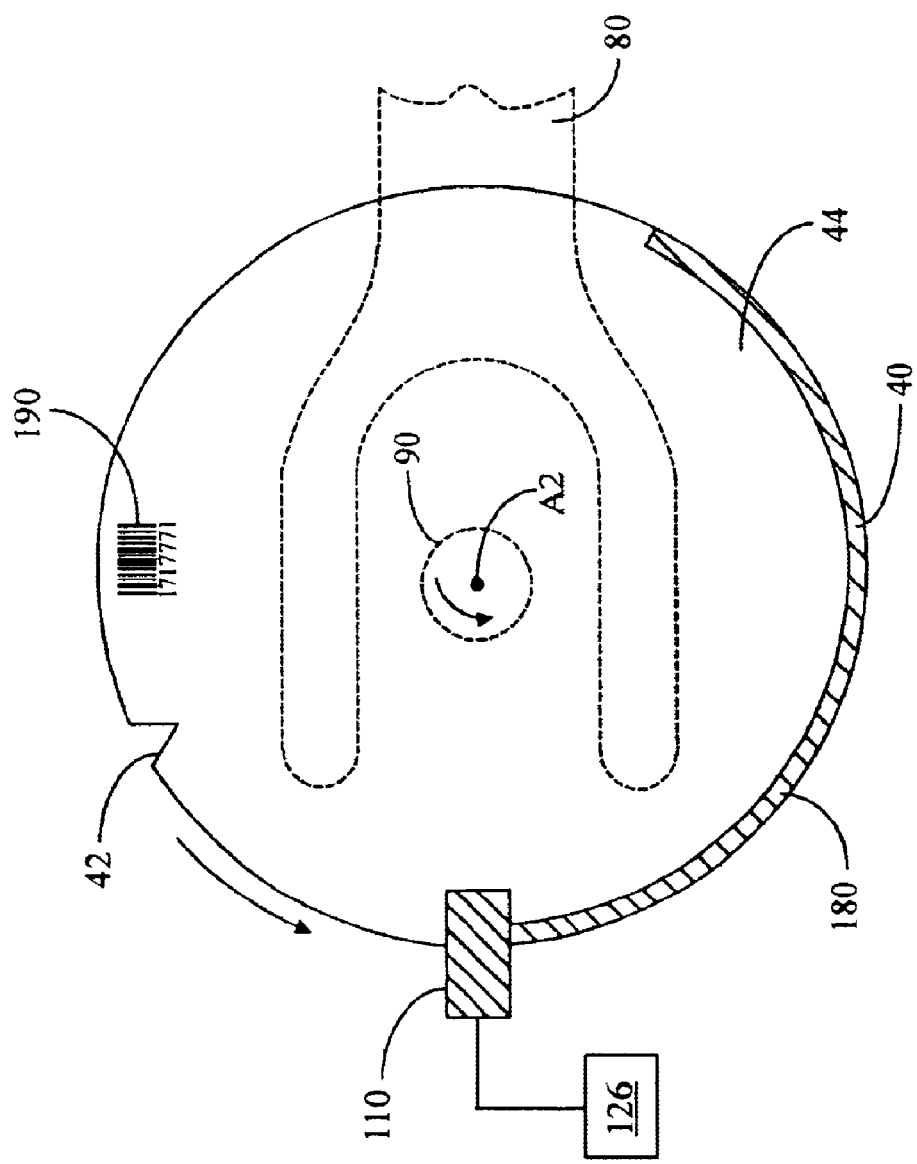
FIG. 3 is a close-up plan view of a portion of the pre-aligner and inkjet head system of FIG. 2 illustrating an annular mask of ink in the process being formed around the edge of a workpiece.

In operation, workpiece 40 to be processed using lithography tool 10 is first arranged on pre-aligner 26. Because pre-aligner 26 has the capability to rotate workpiece 40 via rotation member 90, the rotation of the workpiece can be coordinated with the operation of ink delivery device 110 via control unit 126 and optionally main controller 54 to form a desired mask. For example, to prevent photoresist from remaining on the edge of workpiece 40, the workpiece edge can be rotated beneath ink delivery device 110 while the device deposits a narrow (e.g., several millimeters) annular ink band 180 (shown being formed in FIG. 3). In another example, workpiece 40 is held stationary while ink delivery device 110 scans across a region of the workpiece surface 44 to write a barcode and/or alphanumeric code 190 (FIG. 3), or other indicia.

There are a number of key advantages of using an ink delivery device for performing masking of a workpiece in order to prevent exposure of the workpiece at select photosensitive regions. A first advantage is that the exclusion region can be defined with very high accuracy, and can even be used to define alphanumeric characters A second advantage is that the particular mask pattern can be tailored to suit the array of exposure fields printed on the workpiece using the lithography tool. A third advantage is that the size of the masked regions can be changed by programming the ink delivery device controller rather than by having to make mechanical adjustments of the system. A fourth advantage is that the ink masking does not involve physical contact beyond that of the remotely applied stream ("jet") of ink. Thus, non-flat workpiece surfaces can be accommodated. A fifth advantage is that an ink delivery system for masking the workpiece can readily be made by modifying an existing apparatus within the lithography tool, namely the pre-aligner. Because the masking can be done quickly (less than 5 seconds for most applications) and be performed in-situ at the pre-aligner while another workpiece is being exposed on the workpiece stage, there is minimal impact on the overall lithography process and thus minimal or no impact on throughput. A sixth advantage is that ink delivery devices in the form of inkjet printers are commercially available and not particularly expensive, so that the cost of the masking apparatus and process is minimal.

The many features and advantages of the present invention are apparent from the detailed specification, and, thus, it is intended by the appended claims to cover all such features and advantages of the described apparatus that follow the true spirit and scope of the invention. Furthermore, since numerous modifications and changes will readily occur to those of skill in the art, it is not desired to limit the invention to the exact construction and operation described herein. Accordingly, other embodiments are within the scope of the appended claims.

What is claimed is:

1. An apparatus to apply a selected masking pattern to a photoresist layer on a workpiece to prevent exposure of masked regions of the photoresist layer, comprising:
    a workpiece pre-aligner disposed to movably support and initially align the workpiece;
    a rotation device to engage the workpiece and to rotate the workpiece while being masked; and
    an ink delivery device disposed to be arranged to be in communication with the photoresist layer of the workpiece to apply opaque ink to form the selected masking pattern on the photoresist layer in cooperation with the workpiece pre-aligner as the workpiece is rotated;
    wherein the opaque ink is opaque to a wavelength of radiation that will activate the photoresist layer on the workpiece.

2. An apparatus according to claim 1 further comprising a control unit in communication with the workpiece pre-aligner, the rotation device and the ink delivery device to control the application of ink onto the photoresist layer in the selected masking pattern.

3. An apparatus according to claim 2, wherein the workpiece pre-aligner provides information about the state of the workpiece to the control unit.

4. An apparatus according to claim 3, wherein the control unit is connected to a main controller of a lithography system.

5. An apparatus according to claim 2, wherein the controller is programmable to control the execution of the selected masking pattern on the photoresist layer of the workpiece.

6. An apparatus according to claim 1, wherein the workpiece pre-aligner includes a movable arm disposed to engage and support the workpiece, wherein the movable arm is in operative communication with a workpiece stage of a lithography tool.

7. An apparatus according to claim 1, wherein the photoresist layer is a negative-tone dry film resist.

8. An apparatus according to claim 1, wherein the workpiece pre-aligner is a component of a lithography tool.

9. An apparatus according to claim 1, wherein the ink delivery device delivers fast-drying ink that adheres to polyethylene terephthalate polyester.

10. An apparatus according to claim 1, wherein the ink delivery device is disposed to be moved over the workpiece.

11. An apparatus according to claim 1, wherein the ink delivery device includes an inkjet head.

12. A method for selectively masking a photoresist layer on a workpiece, the method comprising the steps of:
    selecting one or more regions of the photoresist layer on the workpiece that are to be masked;
    rotating the workpiece during masking; and
    masking the one or more selected regions of the photoresist layer of the workpiece, while the workpiece is rotated, with a layer of ink that is opaque to a wavelength of radiation that will activate the photoresist layer on the workpiece.

13. A method according to claim 12, wherein the masking step includes the step of depositing the layer of ink with an inkjet head.

14. A method according to claim 13, further includes the step of programming an inkjet head control unit connected to the inkjet head to control the deposition of the layer of ink.

15. A method according to claim 14, wherein the method further includes the step of coordinating the deposition of the layer of ink with the movement of the workpiece.

16. A method according to claim 13, wherein the masking step includes the step of moving the workpiece and inkjet head relative to each other with the wafer underneath the inkjet head.

17. A method according to claim 12, wherein the workpiece is substantially round having an edge, and the one or more selected regions includes a narrow annulus adjacent the workpiece edge.

18. A method according to claim 12, wherein the masking step includes the step of forming one or more alphanumeric characters.

19. A method according to claim 12, wherein the masking step includes the step of forming a bar code.

20. A method according to claim 12, wherein the the one or more selected regions are outside of an area of the workpiece where exposure fields are to be formed on the workpiece.

* * * * *